(12) United States Patent
Kim et al.

(10) Patent No.: US 9,054,059 B2
(45) Date of Patent: Jun. 9, 2015

(54) FLEXIBLE ORGANIC ELECTROLUMINESCENT DEVICE

(71) Applicant: LG Display Co., Ltd., Seoul (KR)

(72) Inventors: MiSo Kim, Seoul (KR); DoHyung Kim, Gyeonggi-do (KR); SeHwan Na, Gyeonggi-do (KR); ChiMin Choi, Chungcheongnam-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/061,924

(22) Filed: Oct. 24, 2013

(65) Prior Publication Data

US 2014/0117336 A1 May 1, 2014

(30) Foreign Application Priority Data

Oct. 31, 2012 (KR) .................. 10-2012-0122541

(51) Int. Cl.
*H01L 29/08* (2006.01)
*H01L 35/24* (2006.01)
*H01L 51/00* (2006.01)
*H01L 27/32* (2006.01)
*H01L 51/52* (2006.01)

(52) U.S. Cl.
CPC ............ *H01L 27/3246* (2013.01); *H01L 27/32* (2013.01); *H01L 27/3204* (2013.01); *H01L 27/3274* (2013.01); *H01L 51/0097* (2013.01); *H01L 51/5246* (2013.01); *H01L 2251/5338* (2013.01)

(58) Field of Classification Search
CPC . H01L 27/32; H01L 27/3204; H01L 27/3274; H01L 51/0097; H01L 51/5246; H01L 2251/5338
USPC .............................. 257/40, E51.018, E51.019
See application file for complete search history.

(56) References Cited

U.S. PATENT DOCUMENTS

| | | | |
|---|---|---|---|
| 8,097,174 B2 * | 1/2012 | Chung et al. ...................... | 216/2 |
| 8,129,898 B2 * | 3/2012 | Choi et al. ...................... | 313/504 |
| 8,237,165 B2 * | 8/2012 | Kim et al. ...................... | 257/59 |
| 8,481,998 B2 * | 7/2013 | Cho et al. ...................... | 257/40 |
| 8,599,181 B2 * | 12/2013 | Lin et al. ...................... | 345/207 |
| 8,698,170 B2 * | 4/2014 | Kim et al. ...................... | 257/88 |
| 2006/0102900 A1 * | 5/2006 | Shin et al. ...................... | 257/59 |
| 2007/0215969 A1 * | 9/2007 | Koide et al. ...................... | 257/431 |
| 2012/0171795 A1 * | 7/2012 | Yamazaki et al. .............. | 438/34 |

* cited by examiner

*Primary Examiner* — Ida M Soward
(74) *Attorney, Agent, or Firm* — Morgan, Lewis & Bockius LLP

(57) ABSTRACT

The present invention relates to a flexible organic electroluminescent device, and the invention disclosed herein includes a switching thin film transistor and a drive thin film transistor formed at the each pixel region on a substrate; a first electrode connected to a drain electrode of the drive thin film transistor, and formed at the each pixel region; a bank formed on the display area and non-display area of the substrate; a spacer formed on a bank in the non-display area, and disposed in the vertical direction in parallel to a lateral surface of the display area; an organic light emitting layer separately formed for each pixel region; a second electrode formed on an entire surface of the organic light emitting layer; an organic layer formed on an entire surface of the substrate; a barrier film located to face the substrate.

7 Claims, 5 Drawing Sheets

FLEXIBLE ORGANIC ELECTROLUMINESCENT DEVICE

CROSS-REFERENCE TO RELATED APPLICATIONS

This application claims the benefit of Korean Patent Application No. 10-2012-0122541, filed on Oct. 31, 2012, which is hereby incorporated by reference for all purposes as if fully set forth herein.

BACKGROUND OF THE INVENTION

1. Field of the Invention

The present invention relates to an organic electroluminescent device (hereinafter, referred to as an "OLED"), and more particularly, to a flexible organic electroluminescent device for blocking moisture from being infiltrated into the organic electroluminescent device to enhance the life of the organic electroluminescent device.

2. Description of the Related Art

An organic electroluminescent device, which is one of flat panel displays (FPDs), may have high brightness and low operation voltage characteristics. Furthermore, the organic electroluminescent device has a high contrast ratio because of being operated as a self-luminous type display that spontaneously emits light, and allows the implementation of an ultra-thin display. Furthermore, the organic light-emitting diode has advantages such as facilitating the implementation of moving images using a response time of several microseconds (µs), having no limitation in viewing angle, having stability even at low temperatures, and being driven at low voltages between DC 5 to 15 V, thus facilitating the fabrication and design of a driving circuit thereof.

Furthermore, the fabrication process of the organic electroluminescent device can be carried out using only deposition and encapsulation equipment, and therefore the fabrication process is very simple.

The organic light-emitting diode having such characteristics can be largely divided into a passive matrix type and an active matrix type, and in the passive matrix type, a device may be configured with a matrix form in which the scan and signal lines are crossed with each other, and the scan lines are sequentially driven as time passes to drive each pixel, and thus instantaneous brightness as much as average brightness multiplied by the number of lines may be required to display the average brightness.

However, the active matrix type has a structure in which thin-film transistors, which are switching devices for turning on or off a pixel region, are located for each pixel region, and drive transistors connected to the switching transistors are connected to a power line and organic light emitting diodes, and formed for each pixel region.

Here, a first electrode connected to the drive transistor may be turned on or off in the pixel region unit, and a second electrode facing the first electrode may perform the role of a common electrode, thereby implementing an organic light emitting diode along with an organic light emitting layer interposed between the two electrodes.

In the active matrix type having such characteristics, a voltage applied to the pixel region may be charged at a storage capacitance (Cst), and applied until the next frame signal is applied and thus continuously driven for one screen regardless of the number of scan lines.

Accordingly, the same brightness can be obtained even if a low current is applied, thereby having an advantage of providing low power consumption, fine pitch and large screen sized display, and thus in recent years, active matrix type organic electroluminescent devices have been widely used.

The fundamental structure and operating characteristics of such an active matrix type organic electroluminescent device will be described below with reference to the accompanying drawings.

FIG. 1 is a circuit diagram for one pixel region in a typical active matrix type organic electroluminescent device.

Referring to FIG. 1, one pixel region of a typical active matrix type organic electroluminescent device 10 may include a switching thin film transistor (STr), a drive thin film transistor (DTr), a storage capacitor (Cst), and an organic light emitting diode (E).

A gate line (GL) is formed in the first direction, and a data line (DL) disposed in the second direction crossed with the first direction to define a pixel region (P) along with the gate line (GL) is formed, and a power line (PL) separated from the data line (DL) to apply a power voltage is formed.

Furthermore, a switching thin film transistor (STr) is formed at a portion where the data line (DL) and gate line (GL) are crossed with each other, and a drive thin film transistor (DTr) electrically connected to the switching thin film transistor (STr) is formed within the each pixel region (P).

Here, the drive thin film transistor (DTr) is electrically connected to the organic light emitting diode (E). In other words, a first electrode, which is one side terminal of the organic light emitting diode (E), is connected to a drain electrode of the drive thin film transistor (DTr), and a second electrode, which is the other terminal thereof, is connected to the power line (PL). Here, the power line (PL) transfers a power voltage to the organic light emitting diode (E). Furthermore, a storage capacitor (Cst) is formed between a gate electrode and a source electrode of the drive thin film transistor (DTr).

Accordingly, when a signal is applied through the gate line (GL), the switching thin film transistor (STr) is turned on, and the signal of the data line (DL) is transferred to the gate electrode of the drive thin film transistor (DTr) to turn on the drive thin film transistor (DTr), thereby emitting light through the organic light emitting diode (E). Here, when the drive thin film transistor (DTr) is in a turned-on state, the level of a current flowing through the organic light emitting diode (E) from the power line (PL) is determined, and due to this, the organic light emitting diode (E) may implement a gray scale, and the storage capacitor (Cst) may perform the role of constantly maintaining the gate voltage of the drive thin film transistor (DTr) when the switching thin film transistor (STr) is turned off, thereby allowing the level of a current flowing through the organic light emitting diode (E) to be constantly maintained up to the next frame even when the switching thin film transistor (STr) is in an off state.

On the other hand, FIG. 2 is a plan view schematically illustrating a plurality of sub-pixel regions of an organic electroluminescent device according to the related art, as a schematic view showing moisture being infiltrated through one sub-pixel region and diffused up to adjoining sub-pixel regions.

FIG. 3 is a schematic cross-sectional view of an organic electroluminescent device according to the related art.

FIG. 4 is a schematic enlarged cross-sectional view of an organic electroluminescent device according to the related art, as an enlarged cross-sectional view schematically illustrating moisture infiltrated through a bank being diffused along the bank.

Referring to FIG. 2, according to an organic electroluminescent device 10 according to the related art, a display area (AA) is defined on a substrate 11, and a non-display area (NA)

is defined at the outside of the display area (AA), and a plurality of pixel regions (P), each defined as a region surrounded by the gate line (not shown) and the data line (not shown) are provided, and the power line (not shown) is provided in parallel to the data line (not shown) in the display area (AA).

Here, a switching thin film transistor (STr) (not shown) and a drive thin film transistor (DTr) (not shown) are formed in the plurality of pixel regions (SP), respectively, and connected to the drive thin film transistor (DTr).

According to an organic electroluminescent device 10 according to the related art, the substrate 11 formed with the drive thin film transistor (DTr) and organic light emitting diode (E) is encapsulated by a passivation layer (not shown).

Specifically describing the organic electroluminescent device 10 according to the related art, as illustrated in FIG. 3, the display area (AA) is defined, and the non-display area (NA) is defined at the outside of the display area (AA) on the substrate 11, and a plurality of pixel regions (P), each defined as a region surrounded by the gate line (not shown) and the data line (not shown) are provided, and the power line (not shown) is provided in parallel to the data line (not shown) in the display area (AA).

Here, an insulation material, for example, a buffer layer (not shown) formed of silicon oxide ($SiO_2$) or silicon nitride (NiNx), which is an inorganic insulation material, is provided on the substrate 11.

Furthermore, a semiconductor layer 13 made of pure polysilicon to correspond to the drive region (not shown) and switching region (not shown), respectively, and comprised of a first region 13a forming a channel at the central portion thereof and second regions 13b and 13c in which a high concentration of impurities are doped at both lateral surfaces of the first region 13a is formed at each pixel region (SP) within the display area (AA) at an upper portion of the buffer layer (not shown).

A gate insulating layer 15 is formed on the buffer layer (not shown) including the semiconductor layer 13, and the drive region (not shown) and switching region (not shown) are provided on the gate insulating layer 15, and thus a gate electrode 17 is formed to correspond to the first region 13a of each of the semiconductor layer 13.

Furthermore, a gate line (not shown) connected to a gate electrode (not shown) formed in the switching region (not shown) and extended in one direction is formed on the gate insulating layer 15.

On the other hand, an interlayer insulating layer 19 is formed on an entire surface of the display area on the gate electrode 17 and gate line (not shown). Here, a semiconductor layer contact hole (not shown) for exposing the second regions 13b and 13c, respectively, located at both lateral surfaces of the first region 13a of each of the semiconductor layer, is provided on the interlayer insulating layer 19 and the gate insulating layer 15 at a lower portion thereof.

Furthermore, a data line (not shown) crossed with a gate line (not shown) to define the pixel region (SP) and formed of a second metal material, and a power line (not shown) separated therefrom are formed at an upper portion of the interlayer insulating layer 19 including the semiconductor layer contact hole (not shown). Here, the power line (not shown) may be formed to be separated from and in parallel to the gate line (not shown) on a layer formed with the gate line (not shown), namely, the gate insulating layer.

In addition, a source electrode 23a and a drain electrode 23b brought into contact with the second regions 13b and 13c separated from each other, and respectively exposed through the semiconductor layer contact hole (not shown) and formed of the same second metal material as that of the data line (not shown) are formed in the each drive region (not shown) and switching region (not shown) on the interlayer insulating layer 19. Here, the semiconductor layer and gate insulating layer sequentially deposited on the drive region (not shown) and the gate electrode 17 and interlayer insulating layer 19 and the source electrode 23a and drain electrode 23b formed to be separated from each other forms a drive thin film transistor (DTr).

On the other hand, a second interlayer insulating layer 25 and an organic insulating layer 27 having a drain contact hole (not shown) for exposing the drain electrode 23b of the drive thin film transistor (DTr) is formed on the drive thin film transistor (DTr) and switching thin film transistor (not shown).

Furthermore, a first electrode 29 brought into contact with the drain contact hole (not shown) through the drain electrode 23b and the drain contact hole (not shown) of the drive thin film transistor (DTr) and having a separated form for each pixel region (SP) is formed on the organic insulating layer 27.

In addition, banks 31a, 31b are formed in the boundary and non-display area (NA) of each pixel region (SP) on the first electrode 29.

Furthermore, a first spacer 33a is formed at an upper portion of the bank 31a of the each pixel region (SP), and second spacers 33b are formed at regular intervals at an upper portion of the bank 31b of the non-display area (NA). Here, the first spacer 33a of the each pixel region (SP) is formed in a dot shape, and the second spacer 33b of the non-display area (NA) at the outside of the panel is disposed at a regular interval in the horizontal direction perpendicular to the lateral surface of the display area (AA), and as illustrated in FIG. 3, is formed in a bar shape having a relatively larger size than that of the first spacer 33a.

However, in case of the second spacer 33b of the non-display area (NA) at the outside of the panel, an organic layer 41 with fluidity flows along the second spacer 33b as illustrated in FIG. 5 when coating the organic layer during the encapsulation process.

Accordingly, when the organic layer 41 is non-uniformly coated in the outside region of the panel, an inorganic layer successively deposited at the upper portion thereof, namely, the stack coverage of the second passivation layer 43 becomes poor, thereby providing a vapor path.

In addition, an organic light emitting layer 35 comprised of organic light emitting patterns (not shown) for emitting red, green and blue colors, respectively, is formed on the first electrode 29 within each of the pixel region (SP) surrounded by the bank 31a.

Furthermore, a second electrode 37 is formed on an entire surface of the display area (AA) at an upper portion of the organic light emitting layer 35 and bank 31a. Here, the first electrode 29 and second electrode 37 and the organic light emitting layer 35 interposed between the two electrodes 29 and 37 form an organic light emitting diode (E).

On the other hand, a first passivation layer 39 is formed on an entire surface of the substrate including the second electrode 37.

Furthermore, a high organic molecular substance such as a polymer is coated over the first passivation layer 39 to form an organic layer 41.

In addition, a second passivation layer 43 is additionally formed on an entire surface of the substrate including the organic layer 41 to block moisture from being infiltrated through the organic layer 41.

Moreover, an adhesive is located on an entire surface of the substrate including the second passivation layer 43 to face a barrier film 47 for the encapsulation of the organic light emitting diode (E), and the adhesive 45 is completely glued to the substrate 11 and barrier film 47 and interposed between the substrate 11 and barrier film 47.

In this manner, the substrate 101 is fixed to the barrier film 47 through the adhesive 45 to form a panel state, thereby configuring an organic electroluminescent device 10 according to the related art.

However, according to an organic electroluminescent device according to the related art, the second spacer of the non-display area at the outside of the panel is disposed at a regular interval in the horizontal direction perpendicular to the lateral surface of the display area, and since it is formed in a bar shape having a relatively larger size than that of the first spacer, an organic layer with fluidity flows along the second spacer as illustrated in FIG. 5 when coating the organic layer during the encapsulation process.

In this manner, when the organic layer is non-uniformly coated in the outside region of the panel, an inorganic layer successively deposited at the upper portion thereof, namely, the stack coverage of the second passivation layer becomes poor, thereby providing a vapor path.

Furthermore, the non-uniform portion at the outside of the panel has an uneven step, thereby easily creating a bubble when performing a barrier film bonding.

Accordingly, oxygen (O) and moisture ($H_2O$) introduced through the defective portion, namely, part of the organic layer at the outside portion of the panel leads to a reliability problem such as pixel shrinkage or the like, thereby causing a failure.

SUMMARY OF THE INVENTION

The present invention is to solve the foregoing problems in the related art, and an object of the present invention is to provide a flexible organic electroluminescent device with an enhanced spacer structure in which the spacer structure is changed to enhance the reliability of a flexible display.

In order to accomplish the foregoing object, a flexible organic electroluminescent device according to the present invention may include a substrate defined with a display area including a plurality of pixel regions and a non-display area at the outside thereof; a switching thin film transistor and a drive thin film transistor formed at the each pixel region on the substrate; a first electrode connected to a drain electrode of the drive thin film transistor, and formed at the each pixel region; a bank formed on the display area and non-display area of the substrate including the first electrode to insulate each pixel region; a spacer formed on a bank in the non-display area of the substrate, and disposed in the vertical direction in parallel to a lateral surface of the display area; an organic light emitting layer separately formed for each pixel region on the first electrode; a second electrode formed on an entire surface of the display area on the organic light emitting layer; an organic layer formed on an entire surface of the substrate including the second electrode; a barrier film located to face the substrate; and an adhesive interposed between the substrate and barrier film to adhere the substrate to the barrier film so as to implement a panel state.

According to an organic electroluminescent device in accordance with the present invention, the structure of a second and a third spacer located at the outside of the panel may be displayed at regular intervals in a two columnar form in a direction parallel to a lateral surface of the display area, namely, in the vertical direction, or the structure of the second spacer may be disposed in a straight line form in a direction parallel to a lateral surface of the display area, namely, in the vertical form, without disposing them lengthways in a bar shape in perpendicular to the lateral surface of the display area in the non-display area as in the related art, to minimize spread failure during the coating of an organic layer for the encapsulation process as well as minimize a step at the edge portion of the organic layer, thereby suppressing moisture from being infiltrated through the lateral surface of the organic layer.

Furthermore, according to an organic electroluminescent device in accordance with the present invention, the structure of a second and a third spacer located at the outside of the panel may be displayed at regular intervals in a two columnar form in a direction parallel to a lateral surface of the display area, namely, in the vertical direction, or the structure of the second spacer may be disposed in a straight line form in a direction parallel to a lateral surface of the display area, namely, in the vertical form, to prevent spread failure during the coating of an organic layer for the encapsulation process, and enhance the stack coverage of a second passivation layer subsequently formed, thereby preventing moisture from being infiltrated into the lateral surface of the organic layer to enhance the reliability.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Hereinafter, an organic electroluminescent device according to a preferred embodiment of the present invention will be described below with reference to the accompanying drawings.

Figure 1:
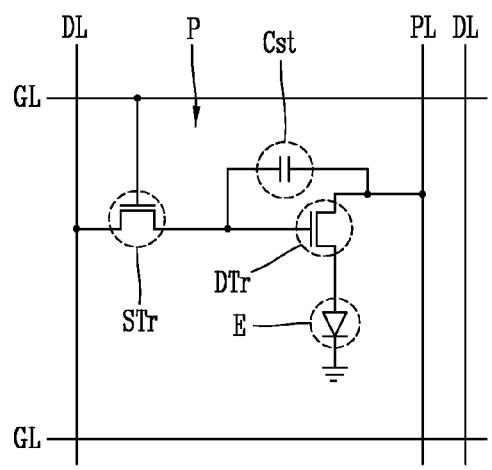
FIG. 1 is a circuit diagram for one pixel region in a typical active matrix type organic electroluminescent device.
Figure 2:
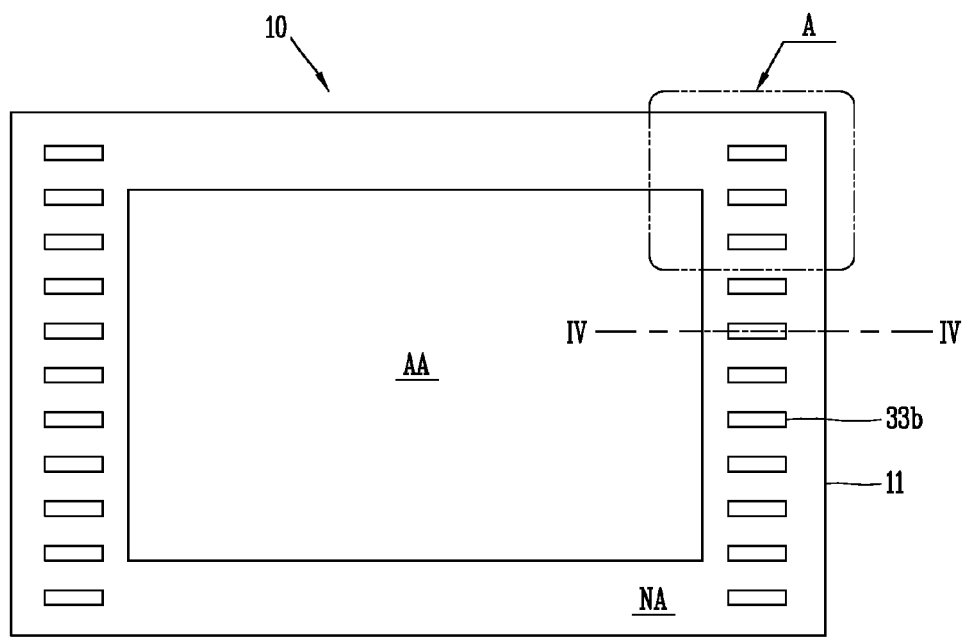
FIG. 2 is a schematic plan view illustrating a display area and a non-display area in a typical organic electroluminescent device in the related art.
Figure 3:
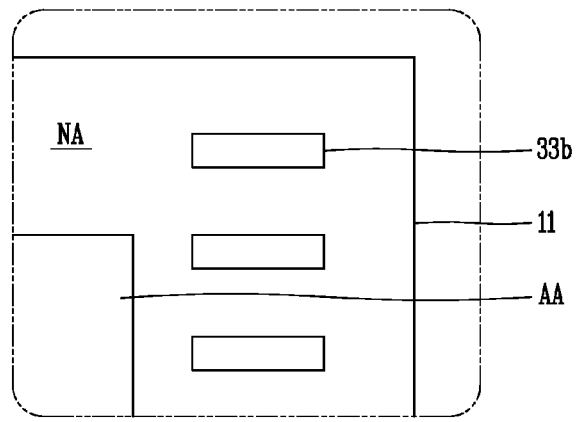
FIG. 3 is an enlarged plan view illustrating a spacer provided in the non-display area in a typical organic electroluminescent device in the related art, as an enlarged plan view of "A" in FIG. 2.
Figure 4:
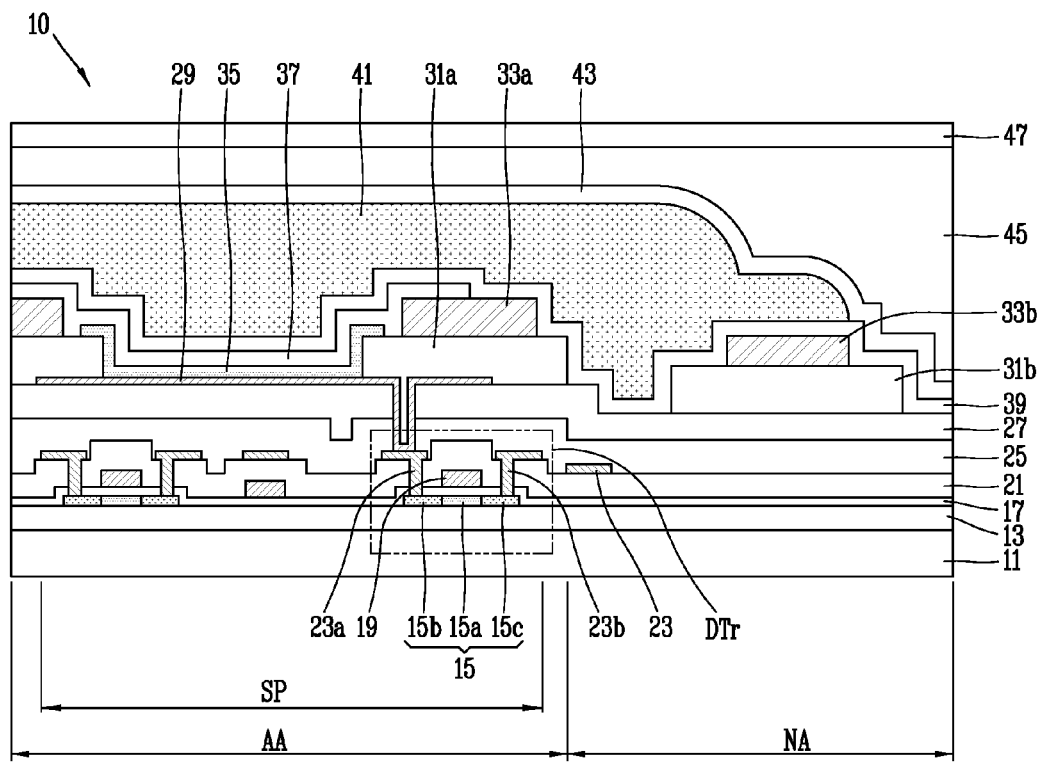
FIG. 4 is a schematic cross-sectional view illustrating a typical organic electroluminescent device in the related art, as a cross-sectional view along line IV-IV in FIG. 2.
Figure 5:
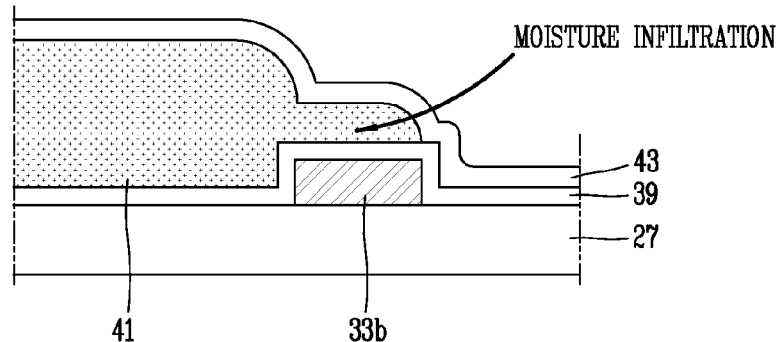
FIG. 5 is an enlarged cross-sectional view schematically illustrating a phenomenon in which moisture permeation occurs from an upper portion of the spacer disposed in the non-display area in a typical organic electroluminescent device in the related art.
Figure 6:
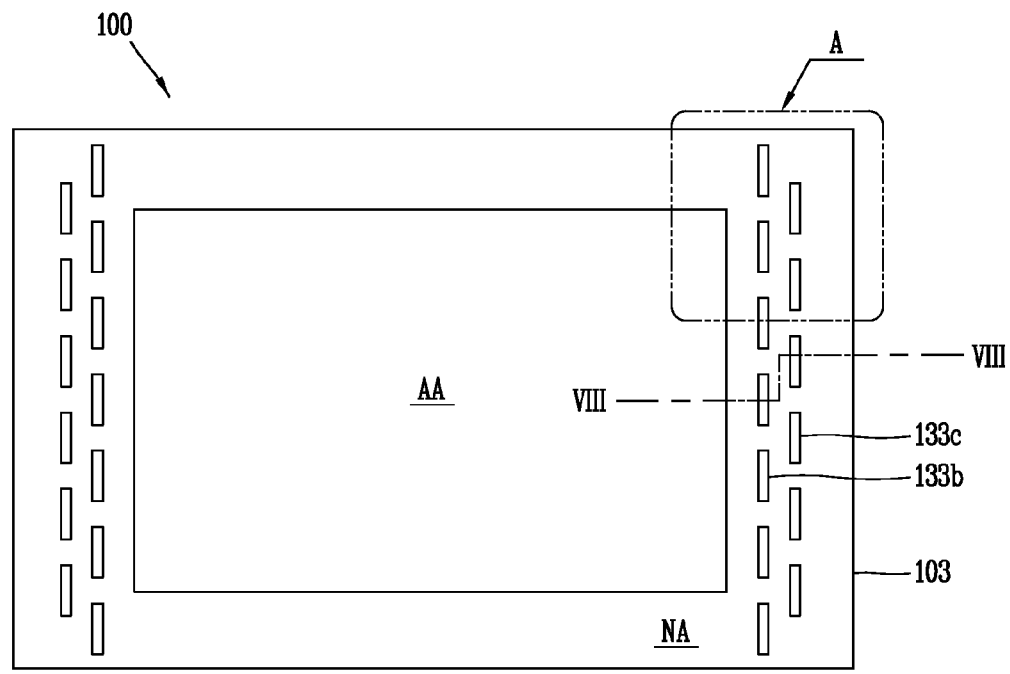
FIG. 6 is a schematic plan view illustrating a display area and a non-display area in a flexible organic electroluminescent device according to an embodiment of the present invention.

FIG. 6 is a schematic plan view illustrating a display area and a non-display area in a flexible organic electroluminescent device according to an embodiment of the present invention.

Figure 7:
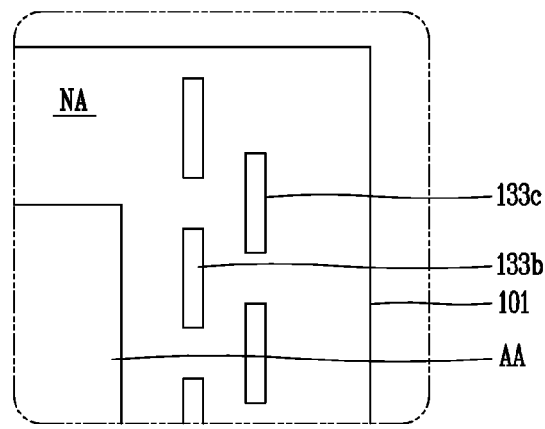
FIG. 7 is an enlarged plan view illustrating a spacer provided in the non-display area in an organic electroluminescent device according to an embodiment of the present invention, as an enlarged plan view of "B" in FIG. 6.

FIG. 7 is an enlarged plan view illustrating a spacer provided in the non-display area in an organic electroluminescent device according to an embodiment of the present invention, as an enlarged plan view of "B" in FIG. 6.

Figure 8:
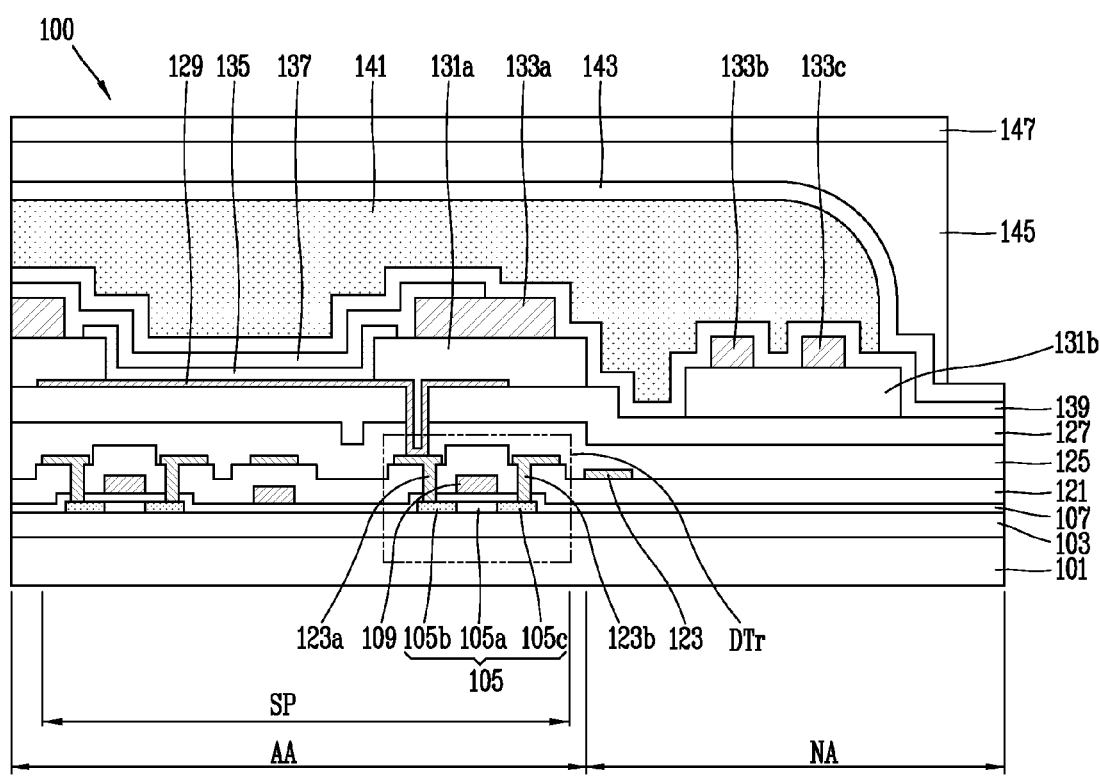
FIG. 8 is a schematic cross-sectional view illustrating an organic electroluminescent device according to an embodiment of the present invention, as a cross-sectional view along line VIII-VIII in FIG. 6.

FIG. 8 is a schematic cross-sectional view illustrating an organic electroluminescent device according to an embodiment of the present invention, as a cross-sectional view along line VIII-VIII in FIG. 6.

A flexible organic electroluminescent device 100 according to an embodiment of the present invention is divided into a top emission type and a bottom emission type according to the transmission direction of emitted light, and hereinafter, according to the present invention, the top emission type will be described as an example.

Referring to FIGS. 6, 7 and 8, in a flexible organic electroluminescent device 100 according to an embodiment of the present invention, a substrate 101 formed with the drive thin film transistor (DTr) and the organic light emitting diodes (E) is encapsulated by a barrier film 147.

Specifically describing the flexible organic electroluminescent device 100 according to an embodiment of the present invention, as illustrated in FIG. 6, a display area (AA) is defined on a substrate 101 having a flexible characteristic, and a non-display area (NA) is defined at the outside of the display area (AA), and a plurality of pixel regions (P), each defined as a region surrounded by the gate line (not shown) and the data line (not shown) are provided, and the power line (not shown) is provided in parallel to the data line (not shown) in the display area (AA).

Here, the flexible substrate 101 is made of a flexible glass substrate or plastic material having a flexible characteristic to maintain display performance as it is even when the flexible organic electroluminescent device 100 is bent like a paper.

Furthermore, a buffer layer 103 made of an insulation material, silicon oxide ($SiO_2$) or silicon nitride (NiNx), which is an inorganic insulation material, is provided on the substrate 101. Here, the buffer layer 103 is formed at a lower portion of the semiconductor layer 105 formed during the subsequent process to prevent the characteristics of the semiconductor layer 105 from being deteriorated due to the emission of alkali ions coming out of an inner portion of the substrate 101 during the crystallization of the semiconductor layer 105.

Furthermore, a semiconductor layer 105 made of pure polysilicon to correspond to the drive region (not shown) and switching region (not shown), respectively, and comprised of a first region 105a forming a channel at the central portion thereof and second regions 105b and 105c in which a high concentration of impurities are doped at both lateral surfaces of the first region 105a is formed at each pixel region (P) within the display area (AA) at an upper portion of the buffer layer 103.

A gate insulating layer 107 is formed on the buffer layer 103 including the semiconductor layer 105, and a gate electrode 109 is formed to correspond to the first region 105a of each of the semiconductor layer 105 in the drive region (not shown) and switching region (not shown) on the gate insulating layer 107.

Furthermore, a gate line (not shown) connected to a gate electrode (not shown) formed in the switching region (not shown) and extended in one direction is formed on the gate insulating layer 107. Here, the gate electrode 109 and the gate line (not shown) may have a single layer structure which is made of a first metal material having a low resistance characteristic, for example, any one of aluminium (Al), aluminium alloy (AlNd), copper (Cu), copper alloy, molybdenum (Mo), and molytitanium (MoTi), or may have a double layer or triple layer structure which is made of two or more of the first metal materials. According to the drawing, it is illustrated that the gate electrode 109 and gate line (not shown) have a single layer structure.

On the other hand, a first interlayer insulating layer 121, which is made of an insulation material, for example, silicon oxide ($SiO_2$) or silicon nitride (NiNx), which is an inorganic insulation material, is formed on an entire surface of the display area on the gate electrode 109 and gate line (not shown). Here, a semiconductor layer contact hole (not shown) for exposing the second regions 105b and 105c, respectively, located at both lateral surfaces of the first region 105a of each of the semiconductor layer, is provided on the first interlayer insulating layer 121 and the gate insulating layer 107 at a lower portion thereof.

Furthermore, a data line 123 crossed with a gate line (not shown) to define the pixel region (SP) and made of a second metal material, for example, any one or two or more of aluminium (Al), aluminium alloy (AlNd), copper (Cu), copper alloy, molybdenum (Mo), molytitanium (MoTi), chromium (Cr), and titanium (Ti), and a power line (not shown) separated therefrom are formed at an upper portion of the first interlayer insulating layer 121 including the semiconductor layer contact hole (not shown). Here, the power line (not shown) may be formed to be separated from and in parallel to the gate line (not shown) on a layer formed with the gate line (not shown), namely, the gate insulating layer.

In addition, a source electrode 123a and a drain electrode 123b brought into contact with the second regions 105b and 105c separated from each other, and respectively exposed through the semiconductor layer contact hole (not shown) and formed of the same second metal material as that of the data line (not shown) are formed in the each drive region (not shown) and switching region (not shown) on the first interlayer insulating layer 121. Here, the semiconductor layer and gate insulating layer sequentially deposited on the drive region (not shown) and the gate electrode 109 and first interlayer insulating layer 121 and the source electrode 123a and drain electrode 123b formed to be separated from each other forms a drive thin film transistor (DTr).

On the other hand, though it is shown in the drawing that all the data line 123 and source electrode 123a and drain electrode 123b have a single layer structure as an example, the constituent elements may have a double layer or triple layer structure.

Here, though not shown in the drawing, a switching thin film transistor (not shown) having the same layer structure as that of the drive thin film transistor (DTr) is also formed in the switching region (not shown). Here, the switching thin film transistor (not shown) is electrically connected to the drive thin film transistor (DTr), the gate line (not shown) and data line 123. In other words, the gate line and data line 123 are connected to a gate electrode (not shown) and a source electrode (not shown), respectively, of the switching thin film transistor (not shown), and the drain electrode (not shown) of the switching thin film transistor (not shown) is electrically connected to the gate electrode 109 of the drive thin film transistor (DTr).

On the other hand, according to the substrate 101 for an organic electroluminescent device in accordance with an embodiment of the present invention, it is shown that the drive thin film transistor (DTr) and switching thin film transistor (not shown) have a semiconductor layer 105 with polysilicon, and configured with a top gate type as an example, but it should be understood by those skilled in the art that the drive thin film transistor (DTr) and switching thin film transistor (not shown) can be also configured with a bottom gate type having a semiconductor layer with amorphous silicon.

When the drive thin film transistor (DTr) and switching thin film transistor (not shown, STr) are configured with a bottom gate type, the layer structure includes a gate electrode, a gate insulating layer, an active layer with pure amorphous silicon, semiconductor layers separated from each other and made of an ohmic contact layer having amorphous silicon doped with impurities, and a source electrode and a drain electrode separated from each other. Here, it has a characteristic that the gate line is formed to be connected to the gate electrode of the switching thin film transistor on a layer formed with the gate electrode, and the data line is formed to be connected to the source electrode on a layer formed with the source electrode of the switching thin film transistor.

On the other hand, a second interlayer insulating layer 125 and an organic insulating layer 127 having a drain contact hole (not shown) for exposing the drain electrode 123b of the drive thin film transistor (DTr) is formed on the drive thin film transistor (DTr) and switching thin film transistor (not shown). Here, silicon oxide ($SiO_2$) or silicon nitride (NiNx), which is an inorganic insulation material, is used for the second interlayer insulating layer 125. Furthermore, a high organic molecular substance such as a polymer is used for the organic insulating layer 127.

Furthermore, a first electrode 129 brought into contact with the drain electrode 123b of the drive thin film transistor (DTr) through the drain contact hole (not shown) and having a separated form for each pixel region (SP) is formed on the organic insulating layer 127.

In addition, banks 131a and 131b made of an insulation material, particularly, for example, benzo-cyclo-butene (BCB), polyimide or photo acryl are formed in the boundary and non-display area (NA) of each pixel region (SP) on the first electrode 129. Here, the bank 131a is formed to be overlapped with the edge of the first electrode 129 in the form of surrounding the each pixel region (SP), and forms a lattice shape having a plurality of opening portions as a whole in the display area (AA). Furthermore, the bank 131b forms a shape covering an upper portion of the drive circuit unit as a whole in the non-display area (NA).

Furthermore, a first spacer 133a is formed at an upper portion of the bank 131a of the each pixel region (SP), and second spacers 133b and 133c are formed at regular intervals at an upper portion of the bank 131b of the non-display area (NA). Here, the first spacer 133a performs the role of maintaining a predetermined gap not to allow a mask to be brought into contact with the substrate 101 during the deposition process of an organic light emitting layer.

In addition, the first spacer 133a of the each pixel region (SP) is formed in a dot shape, and the second and third spacers 133b, 133c of the non-display area (NA) at the outside of the panel are disposed in a two columnar form at regular intervals in the vertical direction in parallel to the lateral surface of the display area (AA). Here, the second and third spacers 133b and 133c are alternately disposed in a two columnar form, and disposed not to correspond to each other. In other words, the long edge of the second and third spacers 133b and 133c is disposed to be located in parallel to one side edge of the display area corresponding to them. In particular, spacers formed in the first column are alternately disposed not to correspond to spacers formed in the second column.

Here, the second and third spacers 133b and 133c of the non-display area (NA) at the outside of the panel performs the role of minimizing the spread when coating the organic layer during the encapsulation process, and allowing it to be uniformly coated at a step of the edge portion.

Furthermore, the second and third spacers 133b and 133c of the non-display area (NA) at the outside of the panel are disposed within the non-display area (NA) located within the non-display area (NA) at both sides of the organic electroluminescent device, namely, within the non-display area (NA) located at a short edge corresponding to each other. It is because the organic layer spread or step may be abruptly formed at the short edge side of the non-display area (NA) during the coating of the organic layer since an area at the short edge side of the organic electroluminescent device is narrower than that at the long edge side.

Accordingly, the second and third spacers 133b and 133c of the non-display area (NA) at the outside of the panel is preferably formed within the non-display area (NA) located at both short edge sides of the organic electroluminescent device.

In addition, an organic light emitting layer 135 comprised of organic light emitting patterns (not shown) for emitting red, green and blue colors, respectively, is formed on the first electrode 129 within each of the pixel region (SP) surrounded by the bank 131a. The organic light emitting layer 135 may be configured with a single layer made of an organic light emitting material, and otherwise, though not shown in the drawing, may be configured with a multiple layer with a hole injection layer, a hole transporting layer, an emitting material layer, an electron transporting layer, and an electron injection layer.

Furthermore, a second electrode 137 is formed on an entire surface of the display area (AA) at an upper portion of the organic light emitting layer 135 and the bank 131a. Here, the first electrode 129 and second electrode 137 and the organic light emitting layer 135 interposed between the two electrodes 129 and 137 form an organic light emitting diode (E).

For the organic light emitting diode (E), when a predetermined voltage is applied to the first electrode 129 and second electrode 137 according to the selected color signal, holes injected from the first electrode 129 and electrons provided from the second electrode 137 is transported to the organic light emitting layer 135 to form excitons, and light is generated and emitted in a visible light form when the excitons is transitioned from the excited state to the ground state. At this time, the emitted light is exited to the outside through the transparent second electrode 137, and thus the flexible organic electroluminescent device 100 implements any image.

On the other hand, a first passivation layer 139 made of an insulation material, particularly, silicon oxide ($SiO_2$) or silicon nitride (NiNx), which is an inorganic insulation material, is formed on an entire surface of the substrate including the second electrode 137. Here, moisture infiltration to the organic light emitting layer 135 cannot be completely suppressed by only the second electrode 137, and thus the first passivation layer 139 is formed on the second electrode 137 to completely suppress moisture infiltration to the organic light emitting layer 135.

Furthermore, a high organic molecular substance such as a polymer is coated over the first passivation layer 139 to form an organic layer 141. Here, olefin polymers (polyethylene, polypropylene), polyethylene terephthalate (PET), epoxy resin, fluororesin, polysiloxane, and the like may be used for the high molecular layer that forms the organic layer 141.

In addition, a second passivation layer 143 made of an insulation material, for example, silicon oxide ($SiO_2$) or silicon nitride (NiNx), which is an inorganic insulation material, is additionally formed on an entire surface of the substrate including the organic layer 141 to block moisture from being infiltrated through the organic layer 141.

Moreover, though not shown in the drawing, an adhesive is located on an entire surface of the substrate including the second passivation layer 143 to face a barrier film 147 for the encapsulation of the organic light emitting diode (E), and the adhesive (not shown) made of any one of a frit having a transparent adhesive characteristic, an organic insulation material, and a high molecular substance is completely glued to the substrate 101 and barrier film 147 with no air layer and interposed between the substrate 101 and barrier film 147. Here, according to the present invention, a case of using a press sensitive adhesive (PSA) for the adhesive 145 will be described as an example.

In this manner, the substrate 101 is fixed to the barrier film 147 through the adhesive 145 to form a panel state, thereby configuring an organic electroluminescent device 100 according to an embodiment of the present invention.

According to an organic electroluminescent device 100 in accordance with an embodiment of the present invention, the structure of a second and a third spacer 133b and 133c located at the outside of the panel may be displayed at regular intervals in a two columnar form in a direction parallel to a lateral surface of the display area (AA), namely, in the vertical direction, without disposing them lengthways in a bar shape in perpendicular to the lateral surface of the display area in the non-display area (AA) as in the related art, to minimize spread failure during the coating of an organic layer for the encapsulation process as well as minimize a step at the edge portion of the organic layer, thereby suppressing moisture from being infiltrated through the lateral surface of the organic layer.

Furthermore, according to an organic electroluminescent device 100 in accordance with an embodiment of the present invention, the structure of a second and a third spacer 133b and 133c located at the outside of the panel may be displayed at regular intervals in a two columnar form in a direction parallel to a lateral surface of the display area (AA), namely, in the vertical direction, to prevent spread failure during the coating of an organic layer for the encapsulation process, and enhance the stack coverage of a second passivation layer subsequently formed, thereby preventing moisture from being infiltrated into the lateral surface of the organic layer to enhance the reliability.

On the other hand, a flexible organic electroluminescent device according to another embodiment of the present invention will be described below with reference to FIGS. 9 and 10.

Figure 9:
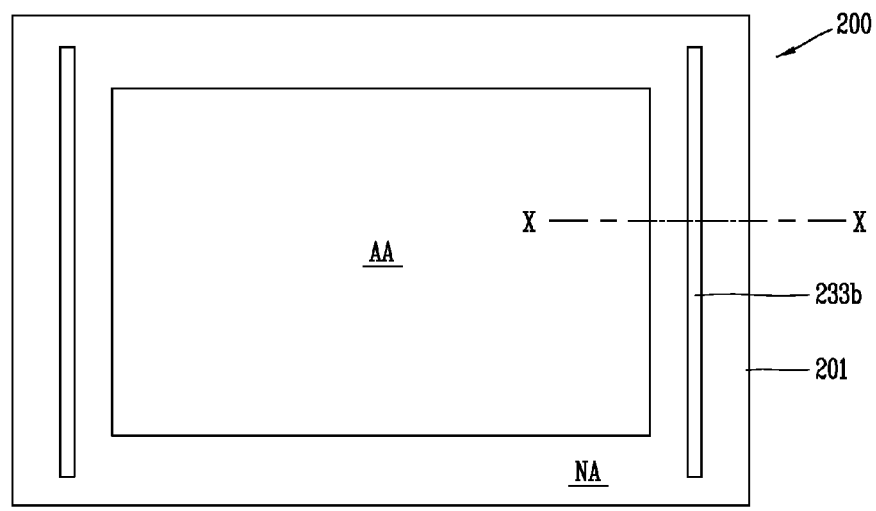
FIG. 9 is a schematic plan view illustrating a display area and a non-display area in a flexible organic electroluminescent device according to another embodiment of the present invention.

FIG. 9 is a schematic plan view illustrating a display area and a non-display area in a flexible organic electroluminescent device according to another embodiment of the present invention.

Figure 10:
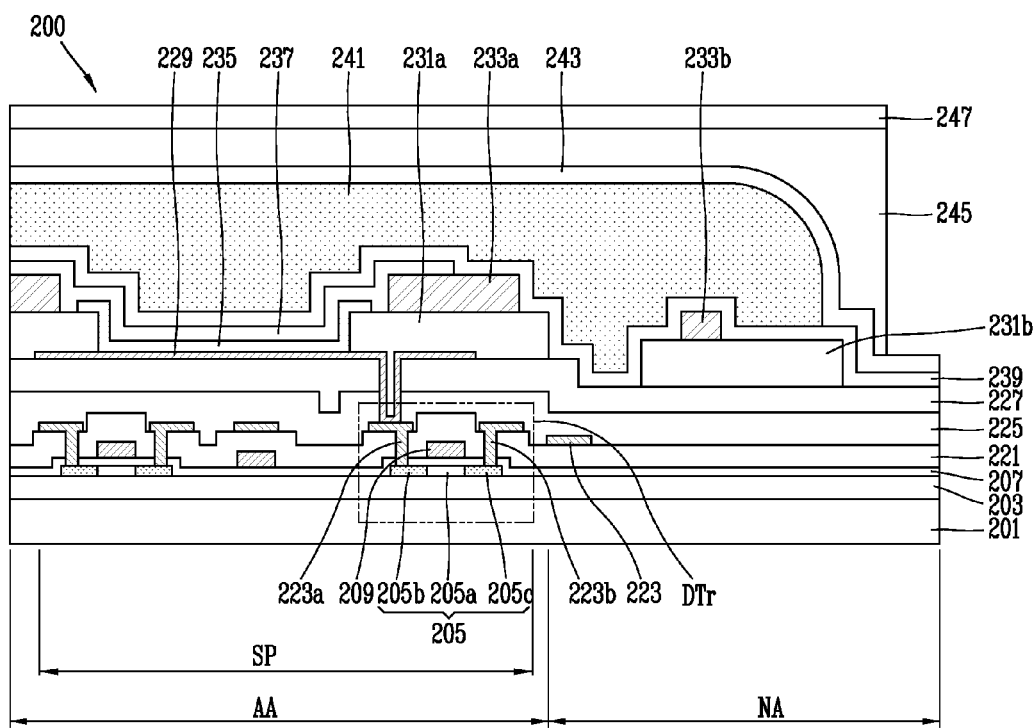
FIG. 10 is a schematic cross-sectional view illustrating an organic electroluminescent device according to another embodiment of the present invention, as a cross-sectional view along line X-X in FIG. 9.

FIG. 10 is a schematic cross-sectional view illustrating an organic electroluminescent device according to another embodiment of the present invention, as a cross-sectional view along line X-X in FIG. 9.

A flexible organic electroluminescent device 200 according to another embodiment of the present invention is divided into a top emission type and a bottom emission type according to the transmission direction of emitted light, and hereinafter, according to the present invention, the top emission type will be described as an example.

Furthermore, the flexible organic electroluminescent device 200 according to another embodiment of the present invention has the same constituent elements as those of the organic electroluminescent device according to an embodiment of the present invention except the structure of a second spacer 233b, but the detailed description thereof will be described below.

Referring to FIGS. 9 and 10, in a flexible organic electroluminescent device 200 according to another embodiment of the present invention, a substrate 101 formed with the drive thin film transistor (DTr) and the organic light emitting diodes (E) is encapsulated by a barrier film 130.

Specifically describing the flexible organic electroluminescent device 200 according to another embodiment of the present invention, as illustrated in FIG. 9, a display area (AA) is defined on a substrate 201 having a flexible characteristic, and a non-display area (NA) is defined at the outside of the display area (AA), and a plurality of pixel regions (P), each defined as a region surrounded by the gate line (not shown) and the data line (not shown) are provided, and the power line (not shown) is provided in parallel to the data line (not shown) in the display area (AA).

Here, the flexible substrate 201 is made of a flexible glass substrate or plastic material having a flexible characteristic to maintain display performance as it is even when the flexible organic electroluminescent device 200 is bent like a paper.

Furthermore, a buffer layer 203 made of an insulation material, silicon oxide ($SiO_2$) or silicon nitride (NiNx), which is an inorganic insulation material, is provided on the substrate 201. Here, the buffer layer 203 is formed at a lower portion of the semiconductor layer 205 formed during the subsequent process to prevent the characteristics of the semiconductor layer 205 from being deteriorated due to the emission of alkali ions coming out of an inner portion of the substrate 201 during the crystallization of the semiconductor layer 205.

Furthermore, a semiconductor layer 205 made of pure polysilicon to correspond to the drive region (not shown) and switching region (not shown), respectively, and comprised of a first region 205a forming a channel at the central portion thereof and second regions 205b and 205c in which a high concentration of impurities are doped at both lateral surfaces of the first region 205a is formed at each pixel region (P) within the display area (AA) at an upper portion of the buffer layer 203.

A gate insulating layer 207 is formed on the buffer layer 203 including the semiconductor layer 205, and a gate electrode 209 is formed to correspond to the first region 205a of each of the semiconductor layer 205 in the drive region (not shown) and switching region (not shown) on the gate insulating layer 207.

Furthermore, a gate line (not shown) connected to a gate electrode (not shown) formed in the switching region (not shown) and extended in one direction is formed on the gate insulating layer 207. Here, the gate electrode 209 and the gate line (not shown) may have a single layer structure which is made of a first metal material having a low resistance characteristic, for example, any one of aluminium (Al), aluminium alloy (AlNd), copper (Cu), copper alloy, molybdenum (Mo), and molytitanium (MoTi), or may have a double layer or triple layer structure which is made of two or more of the first metal materials. According to the drawing, it is illustrated that the gate electrode 209 and gate line (not shown) have a single layer structure.

On the other hand, a first interlayer insulating layer 221, which is made of an insulation material, for example, silicon oxide ($SiO_2$) or silicon nitride (NiNx), which is an inorganic insulation material, is formed on an entire surface of the display area on the gate electrode 209 and gate line (not shown). Here, a semiconductor layer contact hole (not shown) for exposing the second regions 205b and 205c, respectively, located at both lateral surfaces of the first region 205a of each of the semiconductor layer, is provided on the first interlayer insulating layer 221 and the gate insulating layer 207 at a lower portion thereof.

Furthermore, a data line 223 crossed with a gate line (not shown) to define the pixel region (SP) and made of a second metal material, for example, any one or two or more of aluminium (Al), aluminium alloy (AlNd), copper (Cu), copper alloy, molybdenum (Mo), molytitanium (MoTi), chromium (Cr), and titanium (Ti), and a power line (not shown) separated therefrom are formed at an upper portion of the first interlayer insulating layer 221 including the semiconductor layer contact hole (not shown). Here, the power line (not shown) may be formed to be separated from and in parallel to the gate line (not shown) on a layer formed with the gate line (not shown), namely, the gate insulating layer.

In addition, a source electrode 223a and a drain electrode 223b brought into contact with the second regions 205b and 205c separated from each other, and respectively exposed through the semiconductor layer contact hole (not shown) and formed of the same second metal material as that of the data line (not shown) are formed in the each drive region (not shown) and switching region (not shown) on the first interlayer insulating layer 221. Here, the semiconductor layer and gate insulating layer sequentially deposited on the drive region (not shown) and the gate electrode 209 and first interlayer insulating layer 221 and the source electrode 223a and drain electrode 223b formed to be separated from each other forms a drive thin film transistor (DTr).

On the other hand, though it is shown in the drawing that all the data line 223 and source electrode 223a and drain electrode 223b have a single layer structure as an example, the constituent elements may have a double layer or triple layer structure.

Here, though not shown in the drawing, a switching thin film transistor (not shown) having the same layer structure as that of the drive thin film transistor (DTr) is also formed in the switching region (not shown). Here, the switching thin film transistor (not shown) is electrically connected to the drive thin film transistor (DTr), the gate line (not shown) and data line 223. In other words, the gate line and data line 223 are connected to a gate electrode (not shown) and a source electrode (not shown), respectively, of the switching thin film transistor (not shown), and the drain electrode (not shown) of the switching thin film transistor (not shown) is electrically connected to the gate electrode 209 of the drive thin film transistor (DTr).

On the other hand, according to the substrate 201 for an organic electroluminescent device in accordance with an embodiment of the present invention, it is shown that the drive thin film transistor (DTr) and switching thin film transistor (not shown) have a semiconductor layer 205 with polysilicon, and configured with a top gate type as an example, but it should be understood by those skilled in the art that the drive thin film transistor (DTr) and switching thin film transistor (not shown) can be also configured with a bottom gate type having a semiconductor layer with amorphous silicon.

When the drive thin film transistor (DTr) and switching thin film transistor (not shown, STr) are configured with a bottom gate type, the layer structure includes a gate electrode, a gate insulating layer, an active layer with pure amorphous silicon, semiconductor layers separated from each other and made of an ohmic contact layer having amorphous silicon doped with impurities, and a source electrode and a drain electrode separated from each other. Here, it has a characteristic that the gate line is formed to be connected to the gate electrode of the switching thin film transistor on a layer formed with the gate electrode, and the data line is formed to be connected to the source electrode on a layer formed with the source electrode of the switching thin film transistor.

On the other hand, a second interlayer insulating layer 225 and an organic insulating layer 227 having a drain contact hole (not shown) for exposing the drain electrode 223b of the drive thin film transistor (DTr) is formed on the drive thin film transistor (DTr) and switching thin film transistor (not shown). Here, silicon oxide ($SiO_2$) or silicon nitride (NiNx), which is an inorganic insulation material, is used for the second interlayer insulating layer 225. Furthermore, a high organic molecular substance such as a polymer is used for the organic insulating layer 227.

Furthermore, a first electrode 229 brought into contact with the drain electrode 223b of the drive thin film transistor (DTr) through the drain contact hole (not shown) and having a separated form for each pixel region (SP) is formed on the organic insulating layer 227.

In addition, banks 231a and 231b made of an insulation material, particularly, for example, benzo-cyclo-butene (BCB), polyimide or photo acryl are formed in the boundary and non-display area (NA) of each pixel region (SP) on the first electrode 229. Here, the bank 231a is formed to be overlapped with the edge of the first electrode 229 in the form of surrounding the each pixel region (SP), and forms a lattice shape having a plurality of opening portions as a whole in the display area (AA). Furthermore, the bank 231b forms a shape covering an upper portion of the drive circuit unit as a whole in the non-display area (NA).

Furthermore, a first spacer 233a is formed at an upper portion of the bank 231a of the each pixel region (SP), and a second spacer 233b is formed at an upper portion of the bank 231b of the non-display area (NA). Here, the first spacer 233a performs the role of maintaining a predetermined gap not to allow a mask to be brought into contact with the substrate 201 during the deposition process of an organic light emitting layer.

Here, the first spacer 233a of the each pixel region (SP) is formed in a dot shape, and the second spacer 233b of the non-display area (NA) at the outside of the panel is disposed in a bar shape in the vertical direction in parallel to the lateral surface of the display area (AA). In other words, the long edge of the second spacer 233b is disposed to be located in parallel to one side edge of the display area (AA) corresponding to this. Here, the second spacer 233b of the non-display area (NA) at the outside of the panel performs the role of minimizing the spread when coating the organic layer during the encapsulation process, and allowing it to be uniformly coated at a step of the edge portion.

Furthermore, the second spacer 233b of the non-display area (NA) at the outside of the panel are disposed within the non-display area (NA) located within the non-display area (NA) at both sides of the organic electroluminescent device, namely, within the non-display area (NA) located at a short edge corresponding to each other. It is because the organic layer spread or step may be abruptly formed at the short edge side of the non-display area (NA) during the coating of the organic layer since an area, namely, bezel, at the short edge side of the organic electroluminescent device is narrower than that at the long edge side. Accordingly, the second spacer 233b of the non-display area (NA) at the outside of the panel is preferably formed within the non-display area (NA) located at both short edge sides of the organic electroluminescent device.

In addition, an organic light emitting layer 235 comprised of organic light emitting patterns (not shown) for emitting red, green and blue colors, respectively, is formed on the first electrode 229 within each of the pixel region (SP) surrounded by the bank 231a. The organic light emitting layer 235 may be configured with a single layer made of an organic light emitting material, and otherwise, though not shown in the drawing, may be configured with a multiple layer with a hole injection layer, a hole transporting layer, an emitting material layer, an electron transporting layer, and an electron injection layer.

Furthermore, a second electrode 237 is formed on an entire surface of the display area (AA) at an upper portion of the organic light emitting layer 235 and the bank 231a. Here, the first electrode 229 and second electrode 237 and the organic light emitting layer 235 interposed between the two electrodes 229 and 237 form an organic light emitting diode (E).

For the organic light emitting diode (E), when a predetermined voltage is applied to the first electrode 229 and second electrode 237 according to the selected color signal, holes injected from the first electrode 229 and electrons provided from the second electrode 237 is transported to the organic light emitting layer 235 to form excitons, and light is generated and emitted in a visible light form when the excitons is transitioned from the excited state to the ground state. At this time, the emitted light is exited to the outside through the transparent second electrode 237, and thus the flexible organic electroluminescent device 200 implements any image.

On the other hand, a first passivation layer 239 made of an insulation material, particularly, silicon oxide ($SiO_2$) or silicon nitride (NiNx), which is an inorganic insulation material, is formed on an entire surface of the substrate including the second electrode 237. Here, moisture infiltration to the organic light emitting layer 235 cannot be completely suppressed by only the second electrode 237, and thus the first passivation layer 239 is formed on the second electrode 237 to completely suppress moisture infiltration to the organic light emitting layer 235.

Furthermore, a high organic molecular substance such as a polymer is coated over the first passivation layer 239 to form an organic layer 241. Here, olefin polymers (polyethylene, polypropylene), polyethylene terephthalate (PET), epoxy resin, fluororesin, polysiloxane, and the like may be used for the high molecular layer that forms the organic layer 241.

In addition, a second passivation layer 243 made of an insulation material, for example, silicon oxide ($SiO_2$) or silicon nitride (NiNx), which is an inorganic insulation material, is additionally formed on an entire surface of the substrate including the organic layer 241 to block moisture from being infiltrated through the organic layer 241.

Moreover, though not shown in the drawing, an adhesive is located on an entire surface of the substrate including the second passivation layer 243 to face a barrier film 247 for the encapsulation of the organic light emitting diode (E), and the adhesive (not shown) made of any one of a frit having a transparent adhesive characteristic, an organic insulation material, and a high molecular substance is completely glued to the substrate 201 and barrier film 247 with no air layer and interposed between the substrate 201 and barrier film 247.

Here, according to the present invention, a case of using a press sensitive adhesive (PSA) for the adhesive 245 will be described as an example.

In this manner, the substrate 201 is fixed to the barrier film 247 through the adhesive 245 to form a panel state, thereby configuring an organic electroluminescent device 200 according to the present invention.

According to an organic electroluminescent device 200 in accordance with another embodiment of the present invention, the structure of a second spacer 233b located at the outside of the panel may be displayed in a straight line shape in a direction parallel to a lateral surface of the display area (AA), namely, in the vertical direction, without disposing them lengthways in a bar shape in perpendicular to the lateral surface of the display area in the non-display area (AA) as in the related art, to minimize spread failure during the coating of an organic layer for the encapsulation process as well as minimize a step at the edge portion of the organic layer, thereby suppressing moisture from being infiltrated through the lateral surface of the organic layer.

Furthermore, according to an organic electroluminescent device 200 in accordance with another embodiment of the present invention, the structure of a second spacer 233b located at the outside of the panel may be displayed in a straight line shape in a direction parallel to a lateral surface of the display area (AA), namely, in the vertical direction, to prevent spread failure during the coating of an organic layer for the encapsulation process, and enhance the stack coverage of a second passivation layer subsequently formed, thereby preventing moisture from being infiltrated into the lateral surface of the organic layer to enhance the reliability.

However, it may be understood by those skilled in the art that the foregoing present invention can be implemented in other specific forms without changing the technical concept and essential characteristics thereof.

Therefore, it should be understood that the foregoing embodiments are merely illustrative but not restrictive in all aspects. The scope of the present invention is defined by the appended claims rather than by the detailed description, and all changes or modifications derived from the meaning, scope and equivalent concept of the claims should be construed to be embraced by the scope of the present invention.

What is claimed is:

1. A flexible organic electroluminescent device, comprising:
    a substrate defined with a display area including a plurality of pixel regions and a non-display area at the outside thereof;
    a switching thin film transistor and a drive thin film transistor at the each pixel region on the substrate;
    a first electrode connected to a drain electrode of the drive thin film transistor, and being at the each pixel region;
    a bank on the display area and non-display area of the substrate including the first electrode to insulate each pixel region;
    spacers on a bank in the non-display area of the substrate, being in parallel to a lateral surface of the display area, wherein the spacers are separated from each other by a predetermined distance in the non-display area and disposed in a two columnar form;
    an organic light emitting layer separately disposed for each pixel region on the first electrode;
    a second electrode on an entire surface of the display area on the organic light emitting layer;
    an organic layer on an entire surface of the substrate including the second electrode;
    a barrier film located to face the substrate; and an adhesive interposed between the substrate and barrier film to adhere the substrate to the barrier film so as to implement a panel state.

2. The flexible organic electroluminescent device of claim 1, wherein spacers formed in the first column are alternately disposed not to correspond to spacers formed in the second column.

3. The flexible organic electroluminescent device of claim 1, wherein the spacers are disposed in a straight line shape in parallel to a lateral surface of the display area in the non-display area.

4. The flexible organic electroluminescent device of claim 1, wherein a spacer is formed on the bank of the display area.

5. The flexible organic electroluminescent device of claim 1, wherein a passivation layer made of an inorganic insulating material is interposed between an upper and a lower portion of the organic layer.

6. The flexible organic electroluminescent device of claim 1, wherein the substrate is configured with one selected from a flexible glass substrate and a plastic plate.

7. The flexible organic electroluminescent device of claim 1, wherein an interlayer insulating layer made of an inorganic insulating material and an organic insulating layer are interposed between the switching thin film transistor and drive thin film transistor and first electrode.

\* \* \* \* \*